(12) United States Patent
Sunamoto et al.

(10) Patent No.: US 10,262,960 B2
(45) Date of Patent: Apr. 16, 2019

(54) SEMICONDUCTOR ELEMENT HAVING A WARPED SURFACE AND PRODUCTION METHOD THEREOF

(71) Applicant: MITSUBISHI ELECTRIC CORPORATION, Chiyoda-ku, Tokyo (JP)

(72) Inventors: Masatoshi Sunamoto, Tokyo (JP); Ryuji Ueno, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 15/564,301

(22) PCT Filed: Apr. 1, 2016

(86) PCT No.: PCT/JP2016/060937
§ 371 (c)(1),
(2) Date: Oct. 4, 2017

(87) PCT Pub. No.: WO2016/163319
PCT Pub. Date: Oct. 13, 2016

(65) Prior Publication Data
US 2018/0138135 A1    May 17, 2018

(30) Foreign Application Priority Data
Apr. 6, 2015  (JP) ................. 2015-077528

(51) Int. Cl.
*H01L 23/00*  (2006.01)
*C23C 18/36*  (2006.01)
(Continued)

(52) U.S. Cl.
CPC .......... *H01L 24/05* (2013.01); *C23C 18/1637* (2013.01); *C23C 18/1651* (2013.01);
(Continued)

(58) Field of Classification Search
CPC ................ H01L 24/05; H01L 24/03; H01L 2224/03464; H01L 2224/05124;
(Continued)

(56) References Cited

U.S. PATENT DOCUMENTS 7,993,983 B1 *  8/2011  Lin ................ H01L 21/6835
                                                438/106
8,338,954 B2 * 12/2012  Fujiwara ............. H01L 24/03
                                                257/750
(Continued)

FOREIGN PATENT DOCUMENTS

JP  2005-051084 A  2/2005
JP  2005-179724 A  7/2005
(Continued)

OTHER PUBLICATIONS

International Search Report (PCT/ISA/210) dated May 10, 2016, by the Japanese Patent Office as the International Searching Authority for International Application No. PCT/JP2016/060937.
(Continued)

*Primary Examiner* — Alexander O Williams
(74) *Attorney, Agent, or Firm* — Buchanan Ingersoll & Rooney PC (57) ABSTRACT

In a semiconductor element of the present invention, an electroless nickel-phosphorus plating layer and an electroless gold plating layer are formed on both a front-side electrode and a back-side electrode of a front-back conduction-type substrate. The front-side electrode and the back-side electrode are formed of aluminum or an aluminum alloy. The proportion of the thickness of the electroless nickel-phosphorus plating layer formed on the front-side electrode with respect to the thickness of the electroless nickel-phosphorus plating layer formed on the back-side electrode is in a range of 1.0 to 3.5. The semiconductor element of the present invention allows the occurrence of
(Continued)

voids inside solder during mounting by soldering to be prevented.

11 Claims, 2 Drawing Sheets

(51) Int. Cl.
    *C23C 18/42*         (2006.01)
    *H01L 21/288*     (2006.01)
    *C23C 18/16*         (2006.01)
    *C23C 18/32*         (2006.01)
    *C23C 18/18*         (2006.01)
    *C23C 18/54*         (2006.01)

(52) U.S. Cl.
    CPC .......... *C23C 18/1844* (2013.01); *C23C 18/32* (2013.01); *C23C 18/36* (2013.01); *C23C 18/42* (2013.01); *H01L 21/288* (2013.01); *H01L 24/03* (2013.01); *C23C 18/54* (2013.01); *H01L 2224/03464* (2013.01); *H01L 2224/05124* (2013.01); *H01L 2224/05582* (2013.01); *H01L 2224/05644* (2013.01); *H01L 2224/05655* (2013.01)

(58) Field of Classification Search
    CPC ........... H01L 2224/05582; H01L 2224/05655; H01L 2224/05644; H01L 23/00; C23C 18/32; C23C 18/42; C23C 18/1637; C23C 18/1651; C23C 18/16

USPC ........................................................ 257/773
See application file for complete search history.

(56) References Cited

U.S. PATENT DOCUMENTS

| | | | | |
|---|---|---|---|---|
| 2006/0065534 | A1* | 3/2006 | Nakai | C25D 5/02 |
| | | | | 205/118 |
| 2010/0129964 | A1* | 5/2010 | Goh | H01L 21/4832 |
| | | | | 438/124 |
| 2017/0076948 | A1* | 3/2017 | Nakata | H01L 21/288 |

FOREIGN PATENT DOCUMENTS

| | | | | |
|---|---|---|---|---|
| JP | 2005-200687 A | | 7/2005 | |
| JP | 2011-066341 A | | 3/2011 | |
| JP | 2011-77460 A | * | 4/2011 | ............ H02I 21/288 |
| JP | 2011-077460 A | | 4/2011 | |
| JP | 2013-194291 A | | 9/2013 | |

OTHER PUBLICATIONS

Written Opinion (PCT/ISA/237) dated May 10, 2016, by the Japanese Patent Office as the International Searching Authority for International Application No. PCT/JP2016/060937.

Hino et al., Effect of Zincate Treatment on Adhesion of Electroless Ni-P Coating onto Various Aluminum Alloys, *Materials Transactions*, Jul. 29, 2009, pp. 2235-2241, vol. 50, No. 9, The Japan Institute of Light Metals.

* cited by examiner

SEMICONDUCTOR ELEMENT HAVING A WARPED SURFACE AND PRODUCTION METHOD THEREOF

TECHNICAL FIELD

The present invention relates to a semiconductor element and to a production method thereof. In further detail, the present invention relates to a semiconductor element of a front-back conduction type, in particular to a power semiconductor element for power conversion, typified by IGBTs (insulated-gate bipolar transistors), diodes and the like, and to a method for producing the semiconductor element.

BACKGROUND ART

In conventional mounting of semiconductor elements of a front-back conduction type, a back-side electrode of the semiconductor element is soldered to a substrate or the like, and a front-side electrode of the semiconductor element is wire-bonded. In recent years, however, mounting methods that involve direct soldering of a metal electrode of the front-side electrode of the semiconductor element have come to be frequently resorted to from the viewpoint of shortening manufacturing times and reducing material costs. The front-side electrode of the semiconductor element is generally formed of aluminum or of an aluminum alloy. Accordingly, a nickel film, gold film or the like must be formed on the front-side electrode of the semiconductor element, in order to perform soldering.

The nickel film needs to be several μm thick as reduction thereof occurs due to reactions with tin-based solder during soldering. However, only thicknesses of at most about 1.0 μm are ordinarily achieved in cases where a vacuum deposition method such as vapor deposition or sputtering is resorted to. Moreover, excessively increasing the thickness of the nickel film translates into higher production costs. Therefore, plating techniques have gained attention as film formation methods that allow the formation of thick films quickly and at low cost.

Plating techniques include electroless plating, which allows selectively forming a plating layer only at the surface of an electrode formed of aluminum or of an aluminum alloy (hereafter referred to as an "Al electrode"). Palladium catalyst methods and zincate methods are generally resorted to as electroless plating methods.

In a palladium catalyst method, an electroless plating layer is formed by causing palladium to precipitate, as a catalyst nucleus, on the surface of an Al electrode. Although a palladium method is advantageous in that the amount of etching of the Al electrode is small and the smoothness of the surface of the electroless plating layer is good, such a method incurs higher production costs, since palladium is a noble metal.

In a zincate method, an electroless plating layer is formed by substituting zinc for Al on the surface of an Al electrode, to elicit thereby precipitation of catalyst nuclei. Zincate solutions used in this method are inexpensive, and hence the method is widely used.

Actually, Patent Document 1 proposes the feature of selectively forming a nickel plating layer and a gold plating layer, by relying on a zincate method, on the surface of an Al electrode of a semiconductor element.

Patent Document 1: Japanese Patent Application Laid-Open No. 2005-51084

SUMMARY OF THE INVENTION

Technical Problem

To mount a semiconductor element of a front-back conduction type on a module, solder is laid on a substrate, at normal temperature, then the semiconductor element is further placed on the solder, and thereafter the whole is heated in a reflow oven, as a result of which a back-side electrode of the semiconductor element becomes soldered to the substrate. Gases are generated herein that include hydrogen, water and the like contained in the flux of the solder and in the plating film formed on the electrodes. Voids become formed inside the solder when these gases remain inside the solder. Such voids inside the solder hinder electrical conduction and heat conduction, and constitute therefore a cause of malfunction of the semiconductor element. In order to remove the voids inside the solder, slight vibrations or the like have to be applied to the semiconductor element during soldering. However, this requires complex equipment, which translates into lower productivity, in cases where a plurality of semiconductor elements are to be mounted on the substrate.

It is an object of the present invention, arrived at in order to solve the above problems, to provide a semiconductor element and production method thereof that allow the occurrence of voids inside solder during mounting by soldering to be prevented.

Solution to the Problem

As a result of diligent research aimed at solving the above problems, the inventors found that through selective use of the materials of electrodes and plating layers, and by controlling the thickness of the plating layers, a semiconductor element is deliberately warped so that the front surface of the semiconductor element is bowed inward, as a result of which the voids inside the solder are allowed to be readily discharged out, and perfected the present invention on the basis of that finding.

Specifically, the present invention is a semiconductor element in which an electroless nickel-phosphorus plating layer and an electroless gold plating layer are formed on both a front-side electrode and a back-side electrode of a front-back conduction-type substrate, wherein the front-side electrode and the back-side electrode are formed of aluminum or an aluminum alloy; and wherein the proportion of a thickness of the electroless nickel-phosphorus plating layer formed on the front-side electrode with respect to a thickness of the electroless nickel-phosphorus plating layer formed on the back-side electrode is in a range of 1.0 to 3.5.

Further, the present invention is a method for producing a semiconductor element, the method including the formation of a front-side electrode and a back-side electrode on a front-back conduction-type substrate, followed by performing electroless nickel-phosphorus plating and electroless gold plating by a zincate method on both the front-side electrode and the back-side electrode simultaneously, wherein the front-side electrode and the back-side electrode are formed of aluminum or an aluminum alloy; and the proportion of a surface area of the front-side electrode with respect to a surface area of the back-side electrode is set in a range of 0.3 to 0.85.

Advantageous Effects of the Invention

The present invention succeeds in providing a semiconductor element and production method thereof that allow the occurrence of voids inside solder during mounting by soldering to be prevented.

DESCRIPTION OF EMBODIMENTS

Preferred embodiments of the semiconductor element and production method thereof of the present invention will be explained next with reference to accompanying drawings.

Embodiment 1

Figure 1:
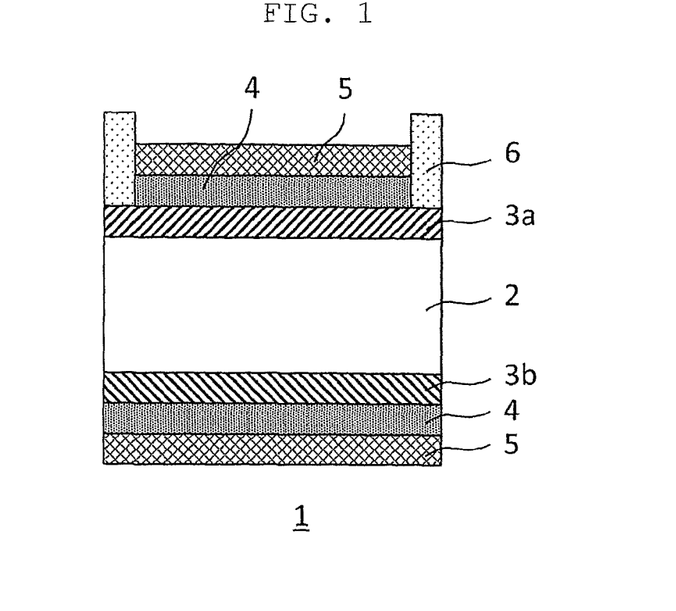
FIG. 1 is a cross-sectional diagram of a semiconductor element of Embodiment 1.

FIG. 1 is a cross-sectional diagram of a semiconductor element of the present embodiment.

In FIG. 1, a semiconductor element 1 of the present embodiment has a front-back conduction-type substrate 2, a front-side electrode 3a formed on one main surface (front surface) of the front-back conduction-type substrate 2, a back-side electrode 3b formed on the other main surface (back surface) of the front-back conduction-type substrate 2, an electroless nickel-phosphorus plating layer 4 formed on the front-side electrode 3a and the back-side electrode 3b, and an electroless gold plating layer 5 formed on each electroless nickel-phosphorus plating layer 4. Further, a protective film 6 is provided on the front-side electrode 3a.

As a characterizing feature of the semiconductor element 1 of the present embodiment, the semiconductor element 1 is deliberately warped so that the front surface of the semiconductor element is bowed inward, in order to prevent the occurrence of voids inside the solder during mounting. Warping of the semiconductor element 1 is not depicted in FIG. 1.

In order to impart warping to the semiconductor element 1 it is necessary to provide, on the front-back conduction-type substrate 2, electrodes and plating layers having a greater coefficient of linear expansion than that of the front-back conduction-type substrate 2. In the semiconductor element 1 of the present embodiment, therefore, the front-side electrode 3a and the back-side electrode 3b formed of aluminum or of an aluminum alloy are selected as electrodes, and the electroless nickel-phosphorus plating layer 4 and the electroless gold plating layer 5 are selected as plating layers. The coefficient of linear expansion of silicon that is generally used in the front-back conduction-type substrate 2 is about 2.3 ppm/° C., whereas the coefficient of linear expansion of aluminum is about 23 ppm/° C., the coefficient of linear expansion of nickel-phosphorus is about 12 to 13 ppm/° C. and the coefficient of linear expansion of gold is about 14.2 ppm/° C.

Next, in order to impart warping to the semiconductor element 1 such that the surface thereof is bowed inward, the thickness of the electrode and plating layers at the front surface of the semiconductor element 1 must be set to be larger than the thickness of the electrode and the plating layers at the back surface of the semiconductor element 1. Among the foregoing, it is preferable to control the thickness of the electrodes and of the electroless nickel-phosphorus plating layer 4, being the thickest among the plating layers and having an easily controllable thickness, from the viewpoint of productivity of the semiconductor element 1. Therefore, the thickness of the electroless nickel-phosphorus plating layer 4 formed on the front-side electrode 3a may be set to be larger than the thickness of the electroless nickel-phosphorus plating layer 4 formed on the back-side electrode 3b.

Specifically, the proportion of the thickness of the electroless nickel-phosphorus plating layer 4 formed on the front-side electrode 3a with respect to the thickness of the electroless nickel-phosphorus plating layer 4 formed on the back-side electrode 3b needs be set to be in the range of 1.0 to 3.5, preferably of 1.05 to 3.5, more preferably of 1.2 to 3.4. When the above proportion is lower than 1.0, warping of the semiconductor element 1 is insufficient, and voids occur within the solder during soldering. If the above proportion exceeds 3.5, on the other hand, warping of the semiconductor element 1 becomes excessive, and the semiconductor element 1 exhibits residual warping after soldering.

A known semiconductor substrate in the relevant technical field, for instance an Si substrate, an SiC substrate, a GaAs compound-based substrate or the like may be used as the front-back conduction-type substrate 2, without particular limitations. The front-back conduction-type substrate 2 has a diffusion layer (not shown) having the function of governing the operation of the semiconductor element 1, for instance a PN junction and of a gate electrode.

As explained above, the front-side electrode 3a and the back-side electrode 3b are formed of aluminum or of an aluminum alloy.

A known aluminum alloy in the relevant technical field can be used, without particular limitations, as the aluminum alloy. Preferably, the aluminum alloy contains an element nobler than aluminum. By incorporating an element nobler than aluminum, electrons from aluminum present around the above element flow readily during electroless nickel-phosphorus plating in accordance with a zincate method, and dissolution of aluminum is promoted as a result. Zinc concentrates and precipitates at portions at which aluminum has dissolved, and there increases the amount of zinc that precipitates as the origin of formation of the electroless nickel-phosphorus plating layer 4. The electroless nickel-phosphorus plating layer 4 is formed readily as a result.

The element nobler than aluminum is not particularly limited, and examples thereof include for instance iron, nickel, tin, lead, silicon, copper, silver, gold, tungsten, cobalt, platinum, palladium, iridium, rhodium and the like. Copper, silicon, iron, nickel, silver and gold are preferred among the foregoing. These elements can be used singly or in combinations of two or more elements.

The content of the elements nobler than aluminum in the aluminum alloy is not particularly limited, but is preferably 5 mass % or less, and is more preferably in the range of 0.05 mass % to 3 mass %, and yet more preferably 0.1 mass % to 2 mass %.

The elements nobler than aluminum contained in the aluminum alloy that is used in the front-side electrode 3a and the back-side electrode 3b may be identical or different. However, the thickness of the electroless nickel-phosphorus plating layer 4 formed on the front-side electrode 3a is made readily larger than the thickness of the electroless nickel-phosphorus plating layer 4 formed on the back-side electrode 3b by prescribing the element contained in the aluminum alloy that forms the front-side electrode 3a to be nobler than the element contained in the aluminum alloy that forms the back-side electrode 3b.

The thickness of the front-side electrode 3a and the back-side electrode 3b is not particularly limited, but the thickness of the front-side electrode 3a is preferably larger than the thickness of the back-side electrode 3b, in terms of imparting warping to the semiconductor element 1 so that the surface thereof is bowed inward.

The thickness of the front-side electrode 3a is ordinarily 1 μm to 8 μm, preferably 2 μm to 7 μm, and more preferably 3 μm to 6 μm.

The thickness of the back-side electrode 3b is ordinarily 0.1 μm to 4 μm, preferably 0.5 μm to 3 μm, and more preferably 0.8 μm to 2 μm.

The electroless nickel-phosphorus plating layer 4 that is formed on the front-side electrode 3a and on the back-side electrode 3b is not particularly limited, and layers of various compositions can be used herein.

The concentration of phosphorus in the electroless nickel-phosphorus plating layer 4 is ordinarily 15 mass % or less, preferably 1 mass % to 12 mass %, and more preferably 3 mass % to 10 mass %. The concentration of phosphorus in the electroless nickel-phosphorus plating layer 4 tends to decrease with increasing thickness of the electroless nickel-phosphorus plating layer 4.

The thicknesses of the electroless nickel-phosphorus plating layer 4 formed on the front-side electrode 3a and on the back-side electrode 3b is not particularly limited, so long as the proportion of thicknesses is as the one explained above.

The thickness of the electroless nickel-phosphorus plating layer 4 formed on the front-side electrode 3a is ordinarily 3 μm to 10 μm, preferably 4 μm to 9 μm and more preferably 3 μm to 8 μm.

The thickness of the electroless nickel-phosphorus plating layer 4 formed on the back-side electrode 3b is ordinarily 1 μm to 7 μm, preferably 1.5 μm to 6 μm and more preferably 2 μm to 5 μm.

The thickness of the electroless gold plating layer 5 formed on the electroless nickel-phosphorus plating layer 4 is not particularly limited, and is generally 0.1 μm or less, preferably 0.01 μm to 0.08 μm, and more preferably 0.02 μm to 0.05 μm.

Preferably, the thickness of the electroless gold plating layer 5 on the front surface is larger than the thickness of the electroless gold plating layer 5 on the back surface, from the viewpoint of imparting warping to the semiconductor element 1 such that the front surface thereof is bowed inward.

A known protective film in the relevant technical field can be used, without particular limitations, as the protective film 6.

The semiconductor element 1 having a structure such as the above exhibits warping in that the front surface of the semiconductor element 1 is bowed inward.

Specifically, the warping amount of the specifically is preferably 0.2 mm to 2 mm, more preferably 0.3 mm to 1.8 mm and yet more preferably 0.4 mm to 1.6 mm. Within such a range of the warping amount, it becomes possible to prevent the occurrence of voids within the solder during mounting of the semiconductor element 1 by soldering.

The warping amount of the semiconductor element 1 signifies herein the distance from the surface of a platen up to ends of the warped semiconductor element 1 when the semiconductor element 1 is laid on the platen with the back surface thereof facing downward.

The semiconductor element 1 having such a structure is produced by forming the front-side electrode 3a and the back-side electrode 3b on the front-back conduction-type substrate 2, and by thereafter subjecting both the front-side electrode 3a and the back-side electrode 3b, simultaneously, to electroless nickel-phosphorus plating and electroless gold plating in accordance with a zincate method.

In order to perform electroless nickel-phosphorus plating simultaneously on both the front-side electrode 3a and the back-side electrode 3b and impart to the semiconductor element 1 warping such that the surface thereof is bowed inward, the proportion of the surface area of the front-side electrode 3a with respect to the surface area of the back-side electrode 3b needs to be set in the range of 0.3 to 0.85, preferably of 0.5 to 0.85 and more preferably of 0.6 to 0.8.

Figure 2:
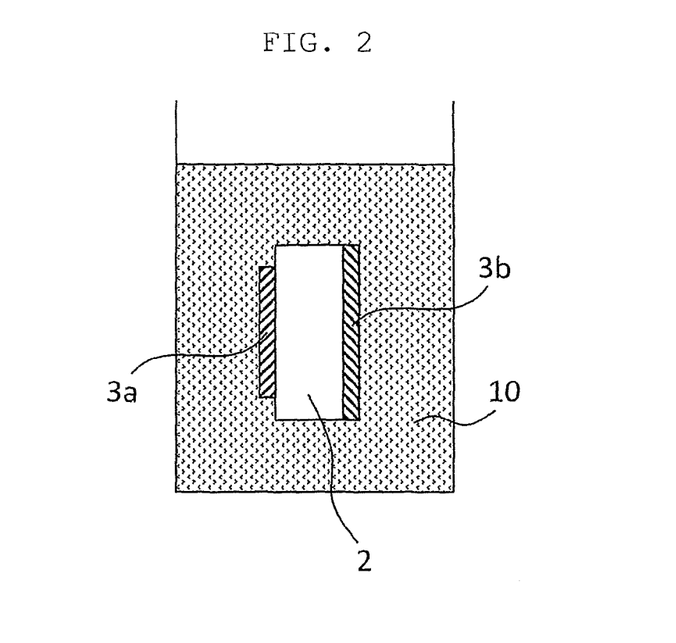
FIG. 2 is a diagram for explaining an electroless nickel-phosphorus plating method.

Specifically, as shown in FIG. 2, the front-back conduction-type substrate 2 on which there are formed the front-side electrode 3a and the back-side electrode 3b having different surface areas may be immersed in an electroless nickel-phosphorus plating solution 10. The protective film 6 is omitted in FIG. 2. The formation rate of the electroless nickel-phosphorus plating layer 4 on the front-side electrode 3a and on the back-side electrode 3b can be modified by providing a difference, such as the above, between the surface areas of the front-side electrode 3a and the back-side electrode 3b. Therefore, it becomes possible to form electroless nickel-phosphorus plating layers 4 of different thicknesses on the front-side electrode 3a and the back-side electrode 3b.

The bath load may be changed in order to modify the formation rate of the electroless nickel-phosphorus plating layer 4 on the front-side electrode 3a and on the back-side electrode 3b. Herein, the term bath load denotes a value resulting from dividing the surface area ($dm^2$) of the electrodes on which electroless nickel-phosphorus plating is performed by the volume (L) of plating solution. The bath load of the front-side electrode 3a is preferably 0.2 $dm^2/L$ to 2 $dm^2/L$, and more preferably 0.3 $dm^2/L$ to 1.5 $dm^2/L$. The bath load of the back-side electrode 3b is preferably 1.0 $dm^2/L$ to 10 $dm^2/L$, and more preferably 2.0 $dm^2/L$ to 9.0 $dm^2/L$.

Figure 3:
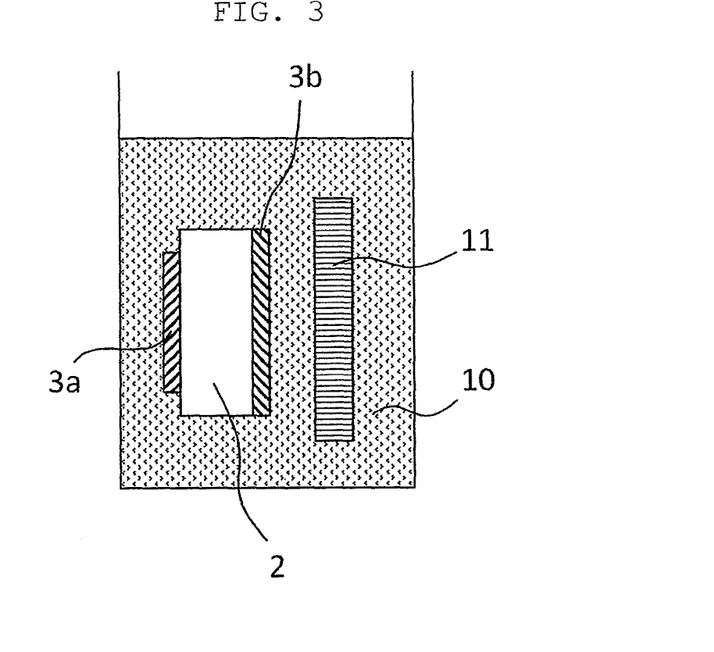
FIG. 3 is a diagram for explaining another electroless nickel-phosphorus plating method.

In order to modify the formation rate of the electroless nickel-phosphorus plating layer 4 on the front-side electrode 3a and on the back-side electrode 3b, electroless nickel-phosphorus plating may be performed while arranging a dummy material 11 at a position opposing the back-side electrode 3b, as illustrated in FIG. 3. The protective film 6 is omitted in FIG. 3. Performing electroless nickel-phosphorus plating in accordance with such a method allows an increase in the difference in formation rate of the electroless nickel-phosphorus plating layer 4 between the front-side electrode 3a and the back-side electrode 3b.

The material of the dummy material 11 is not particularly limited, so long as the electroless nickel-phosphorus plating layer 4 can be formed easily. Examples of the dummy material 11 include for instance iron, platinum, gold, nickel, cobalt, silver and alloys of the foregoing. Iron, platinum, gold, nickel and cobalt are preferred among the foregoing.

The distance between the back-side electrode 3b and the dummy material 11 is not particularly limited, but is preferably 2 mm to 20 mm, more preferably 3 mm to 15 mm, yet more preferably 4 mm to 12 mm and most preferably 5 mm to 10 mm.

Figure 4:
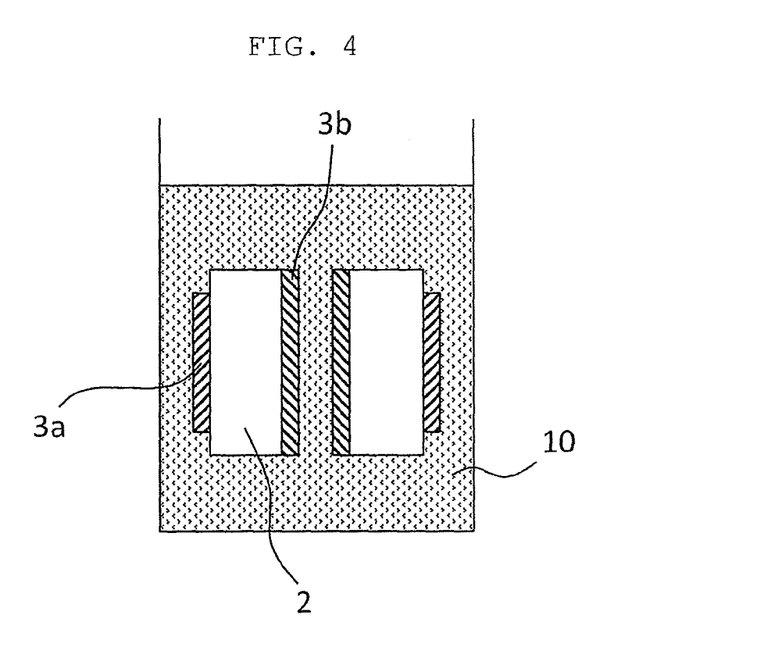
FIG. 4 is a diagram for explaining yet another electroless nickel-phosphorus plating method.

In order to modify the formation rate of the electroless nickel-phosphorus plating layer 4 on the front-side electrode 3a and on the back-side electrode 3b, a plurality of front-back conduction-type substrates 2 having formed thereon the front-side electrode 3a and the back-side electrode 3b may be prepared, and then the electroless nickel-phosphorus plating may be performed while opposing the back-side electrodes 3b of the front-back conduction-type substrates 2 each other, as illustrated in FIG. 4. The protective film 6 is omitted in FIG. 4. Performing electroless nickel-phosphorus plating in accordance with such a method allows an increase in the difference in formation rate of the electroless nickel-phosphorus plating layer 4 between the front-side electrode 3a and the back-side electrode 3b, and allows the electroless nickel-phosphorus plating to be performed simultaneously on the front-side electrode 3a and the back-side electrode 3b formed on a plurality of front-back conduction-type substrates 2, so that productivity is increased as a result.

The distance between back-side electrodes 3b is not particularly limited, but is preferably 2 mm to 50 mm, more preferably 3 mm to 40 mm, yet more preferably 4 mm to 35 mm and most preferably 5 mm to 30 mm.

Methods for forming the front-side electrode 3a and the back-side electrode 3b on the front-back conduction-type substrate 2 are known in the relevant technical field, and accordingly will not be explained herein; instead, an explanation follows next on electroless nickel-phosphorus plating and electroless gold plating, relying on a zincate method.

Generally, a plasma cleaning step, a degreasing step, a pickling step, a first zincate treatment step, a zincate stripping step, a second zincate treatment step, an electroless nickel-phosphorus plating step and an electroless gold plating step are sequentially performed, in this order, to form the electroless nickel-phosphorus plating layer 4 and electroless gold plating layer 5 on the front-side electrode 3a and the back-side electrode 3b that are formed on the front-back conduction-type substrate 2. Treatment solution or residue from a previous step should be prevented from being brought over to a subsequent step, through sufficient washing with water between steps. An outline of the various steps will be explained next.

In the plasma cleaning step, plasma cleaning is performed on the front-side electrode 3a and on the back-side electrode 3b formed on the front-back conduction-type substrate 2. The purpose of plasma cleaning is to remove, for instance through oxidative decomposition by plasma, organic matter residue, nitrides and oxides strongly adhered to the front-side electrode 3a and the back-side electrode 3b, to secure the reactivity between the front-side electrode 3a and the back-side electrode 3b and a plating pretreatment solution or plating solution. Plasma cleaning is performed on both the front-side electrode 3a and the back-side electrode 3b, but is preferably performed with emphasis on the front-side electrode 3a. The order in plasma cleaning is not particularly limited, but preferably the front-side electrode 3a is subjected to plasma cleaning after plasma cleaning of the back-side electrode 3b. That is because the protective film 6 made up of organic matter is present together with the front-side electrode 3a on the front side of the semiconductor element 1, and residue of the protective film 6 often becomes adhered to the front-side electrode 3a.

The degreasing step involves degreasing the front-side electrode 3a and the back-side electrode 3b. Degreasing is performed for the purpose of removing organic matter, oils and fats and oxide films that are lightly adhered to the surface of the front-side electrode 3a and of the back-side electrode 3b. Generally, degreasing of the front-side electrode 3a and the back-side electrode 3b is performed using an alkaline chemical solution having strong etching power. Oils and fats become saponified in the degreasing step. Among non-saponifying substances, alkali-soluble substances are dissolved in the above chemical solution while alkali-insoluble substances undergo lift-off through etching of the front-side electrode 3a and the back-side electrode 3b.

The front-side electrode 3a and the back-side electrode 3b are pickled in the pickling step. Pickling is performed for the purpose of neutralizing the surface of the front-side electrode 3a and of the back-side electrode 3b, and roughening the surface through etching, to increase reactivity towards treatment solutions in later steps, and enhance plating adhesion.

The front-side electrode 3a and the back-side electrode 3b are zincated in the first zincate treatment step. A zincate treatment denotes herein a process of forming a coating film of zinc while removing an oxide film, through etching of the surface of the front-side electrode 3a and of the back-side electrode 3b. Generally, when the front-side electrode 3a and the back-side electrode 3b are immersed in an aqueous solution having zinc dissolved therein (zincate treatment solution), aluminum dissolves in the form of ions, since zinc has a nobler standard redox potential than the aluminum or aluminum alloy that makes up the front-side electrode 3a and the back-side electrode 3b. The electrons generated as a result are taken up by the zinc ions at the surface of the front-side electrode 3a and of the back-side electrode 3b, whereupon a coating film of zinc becomes formed on the surface of the front-side electrode 3a and of the back-side electrode 3b.

In the zincate stripping step, the front-side electrode 3a and the back-side electrode 3b having a zinc coating film formed on the surface are immersed in nitric acid, to dissolve the zinc.

In the second zincate treatment step, the front-side electrode 3a and the back-side electrode 3b obtained in the zincate stripping step immersed once more in a zincate treatment solution. As a result, a zinc coating film becomes formed on the surface of the front-side electrode 3a and of the back-side electrode 3b while aluminum and oxide films thereof are removed.

The reason for performing the zincate stripping step and the second zincate treatment step is to render the surface of the front-side electrode 3a and of the back-side electrode 3b smoother. The greater the number of repeats of the zincate treatment step and the zincate stripping step, the smoother becomes the surface of the front-side electrode 3a and of the back-side electrode 3b, and the greater becomes the homogeneity of the electroless nickel-phosphorus plating layer 4 and of the electroless gold plating layer 5 that are formed. Preferably, however, the zincate treatment is performed twice, and more preferably three times, in terms of striking a balance between surface smoothness and productivity.

In the electroless nickel-phosphorus plating step, the front-side electrode 3a and the back-side electrode 3b having a zinc coating film formed thereon is immersed in the electroless nickel-phosphorus plating solution 10, to form the electroless nickel-phosphorus plating layer 4 as a result. When the front-side electrode 3a and the back-side electrode 3b having the zinc coating film formed thereon are immersed in the electroless nickel-phosphorus plating solution 10, nickel precipitates initially on the front-side electrode 3a and the back-side electrode 3b, since the standard redox potential of zinc is less noble than that of nickel. Next, the surface is covered with nickel, whereupon nickel precipitates autocatalytically through the action of a reducing agent contained in the electroless nickel-phosphorus plating solution 10. The component of the reducing agent (hypophosphorous acid) is taken up into the plating film during this autocatalytical precipitation, as a result of which there is formed the electroless nickel-phosphorus plating layer 4 in the form of an alloy. The electroless nickel-phosphorus plating layer 4 becomes non-crystalline when the concentration of the reducing agent is high. Hydrogen gas is continuously generated throughout the electroless nickel-phosphorus plating, as a result of which hydrogen becomes occluded in the electroless nickel-phosphorus plating layer 4.

In the electroless gold plating step, the electroless gold plating layer 5 is formed by performing electroless gold plating on the front-side electrode 3a and the back-side electrode 3b having the electroless nickel-phosphorus plating layer 4 formed thereon. Electroless gold plating is ordinarily carried out by so-called displacement. In displacement-type electroless gold plating, nickel in the electroless nickel-phosphorus plating layer 4 is replaced by gold through the action of a complexing agent contained in an electroless gold plating solution. The reaction in electroless gold plating stops when the surface of the electroless nickel-phosphorus plating layer 4 becomes covered with gold. It is accordingly difficult to thicken the electroless gold plating layer 5, the thickness of which is at most 0.08μ, and is ordinarily about 0.08 μm. Even at such a value of thickness, however, it is not found that the thickness of the electroless gold plating layer 5 is excessively small, in cases where the electroless gold plating layer 5 is used for soldering.

EXAMPLES

The present invention will be explained next in detail by way of examples, but the invention is not meant to be limited to or by these examples.

Example 1

A semiconductor element 1 having the structure illustrated in FIG. 1 was produced in Example 1.

Firstly, there was prepared an Si substrate (14 mm×14 mm) having a 70 μm thick diffusion layer, as the front-back conduction-type substrate 2.

Next, an aluminum electrode (thickness 5 μm) as the front-side electrode 3a and a protective film 6 were formed on the front surface of the Si substrate, and an aluminum electrode (thickness 1 μm) as the back-side electrode 3b was formed on the back surface of the Si substrate. The proportion of the surface area of the front-side electrode 3a with respect to the surface area of the back-side electrode 3b was set to 0.60.

The semiconductor element 1 was obtained next by performing the various steps under the conditions given in Table 1. Electroless nickel-phosphorus plating was carried out in accordance with the method illustrated in FIG. 2. Washing with pure water was performed between each step.

TABLE 1

| Step | Item | Conditions etc. |
|---|---|---|
| 1 | Plasma cleaning | Ar (100 cc/min); 800 W; 2 min; degree of vacuum 10 Pa |
| 2 | Degreasing | Alkaline degreasing solution; pH 9.5; 70° C.; 3 min |
| 3 | Pickling | 10% sulfuric acid; 30° C.; 1 min |
| 4 | First zincate treatment | Alkaline zincate treatment solution; pH 12; 25° C.; 20 sec |
| 5 | Zincate stripping | Nitric acid; 25° C.; 15 sec |
| 6 | Second zincate treatment | Alkaline zincate treatment solution; pH 12; 25° C.; 20 sec |

TABLE 1-continued

| Step | Item | Conditions etc. |
|---|---|---|
| 7 | Electroless nickel-phosphorus plating | Acidic electroless nickel-phosphorus plating solution; pH 5.0; 85° C.; 25 min |
| 8 | Electroless gold plating | Acidic electroless gold plating solution; pH 6.5; 90° C.; 30 min |

The thickness of the electroless nickel-phosphorus plating layer 4 and of the electroless gold plating layer 5 formed on the front-side electrode 3a and on the back-side electrode 3b was measured using a commercially available fluorescence X-ray film thickness measuring device. As a result it was found that the thickness of the electroless nickel-phosphorus plating layer 4 and of the electroless gold plating layer 5 formed on the front-side electrode 3a was 7.1 μm and 0.03 μm, respectively. The thickness of the electroless nickel-phosphorus plating layer 4 and of the electroless gold plating layer 5 formed on the back-side electrode 3b was 3.9 μm and 0.03 μm, respectively.

Next, the concentration of phosphorus in the electroless nickel-phosphorus plating layer 4 formed on the front-side electrode 3a and on the back-side electrode 3b was measured by ICP, after dissolution of the electroless nickel-phosphorus plating layer 4 in water containing an acid or an alkali. As a result it was found that the concentration of phosphorus in the electroless nickel-phosphorus plating layer 4 formed on the front-side electrode 3a was 6.9 mass, and the concentration of phosphorus of the electroless nickel-phosphorus plating layer 4 formed on the back-side electrode 3b was 8.2 mass.

Next, the produced semiconductor element 1 was placed on a platen, with the back surface of the semiconductor element 1 facing downward, and the distance from the platen surface up to the ends of the warped semiconductor element 1 was measured as the warping amount of the semiconductor element 1. As a result it was found that the warping amount was 0.7 mm.

The results of Example 1 are given in Table 2.

TABLE 2

| Front surface | Electroless nickel-phosphorus plating layer (μm) | 7.1 |
|---|---|---|
| | Electroless gold plating layer (μm) | 0.03 |
| Back surface | Electroless nickel-phosphorus plating layer (μm) | 3.9 |
| | Electroless gold plating layer (μm) | 0.03 |
| Proportion of the thickness of the electroless nickel-phosphorus plating layer [1] | | 1.8 |
| Proportion of the surface area of the electrode [2] | | 0.60 |
| Warp amount (mm) | | 0.7 |

(Remarks)
[1] Proportion of the thickness of the electroless nickel-phosphorus plating layer formed on the front-side electrode with respect to the thickness of the electroless nickel-phosphorus plating layer formed on the back-side electrode.
[2] Proportion of the surface area of the front-side electrode with respect to the surface area of the back-side electrode.

Example 2

A semiconductor element 1 having the structure illustrated in FIG. 1 was produced in Example 2.

Firstly, there was prepared an Si substrate (14 mm×14 mm) having a 70 μm thick diffusion layer, as the front-back conduction-type substrate 2.

Next, an aluminum electrode (thickness 5 μm) as the front-side electrode 3a and a protective film 6 were formed on the front surface of the Si substrate, and an aluminum alloy electrode (thickness 1 μm) as the back-side electrode 3b was formed on the back surface of the Si substrate. Herein predetermined elements were incorporated in the aluminum alloy electrode in predetermined proportions, as given in Table 3. The proportion of the surface area of the front-side electrode 3a with respect to the surface area of the back-side electrode 3b was set to 0.60.

TABLE 3

| Sample No. | Front-side electrode | | Front-side electrode | |
|---|---|---|---|---|
| | Contained element | Content (mass %) | Contained element | Content (mass %) |
| 2-1 | Si | 1.0 | Si | 0.1 |
| 2-2 | Si | 1.0 | Si | 0.5 |
| 2-3 | Cu | 0.3 | Cu | 0.2 |
| 2-4 | Ni | 1.5 | Ni | 0.8 |

Next, semiconductor elements 1 were obtained by performing various steps in accordance with the same method and under the same conditions as in Example 1.

The thickness of the electroless nickel-phosphorus plating layer 4 and of the electroless gold plating layer 5 formed on the front-side electrode 3a and on the back-side electrode 3b and the warping amount of each semiconductor element 1 were measured in the same way as in Example 1. The results are given in Table 4.

TABLE 4

| | | Sample No. | | | |
|---|---|---|---|---|---|
| | | 2-1 | 2-2 | 2-3 | 2-4 |
| Front surface | Electroless nickel-phosphorus plating layer (μm) | 6.9 | 6.5 | 7.5 | 6.0 |
| | Electroless gold plating layer (μm) | 0.03 | 0.03 | 0.03 | 0.03 |
| Back surface | Electroless nickel-phosphorus plating layer (μm) | 4.4 | 4.6 | 2.9 | 4.5 |
| | Electroless gold plating layer (μm) | 0.03 | 0.03 | 0.03 | 0.03 |
| Proportion of the thickness of the electroless nickel-phosphorus plating layer [1] | | 1.6 | 1.4 | 2.6 | 1.3 |
| Proportion of the surface area of the electrode [2] | | 0.6 | 0.6 | 0.6 | 0.6 |
| Warp amount (mm) | | 0.9 | 0.7 | 1.1 | 0.4 |

(Remarks)
[1] Proportion of the thickness of the electroless nickel-phosphorus plating layer formed on the front-side electrode with respect to the thickness of the electroless nickel-phosphorus plating layer formed on the back-side electrode.
[2] Proportion of the surface area of the front-side electrode with respect to the surface area of the back-side electrode.

Example 3

Semiconductor elements 1 having the structure illustrated in FIG. 1 were produced in Example 3.

In Example 3 an experiment was carried out by modifying the type of the aluminum alloy that was used in the front-side electrode 3a and the back-side electrode 3b. Herein predetermined elements were incorporated into the aluminum alloy, in predetermined proportions, as given in Table 5. The proportion of the surface area of the front-side electrode 3a with respect to the surface area of the back-side electrode 3b was set to 0.60.

TABLE 5

| Sample No. | Front-side electrode | | Front-side electrode | |
|---|---|---|---|---|
| | Contained element | Content (mass %) | Contained element | Content (mass %) |
| 3-1 | Cu | 0.5 | Ni | 0.1 |
| 3-2 | Cu | 0.5 | Si | 0.5 |
| 3-3 | Cu/Si | 0.5/1.0 | Si | 0.2 |
| 3-4 | Ag | 0.1 | Cu | 0.2 |

Next, semiconductor elements 1 were obtained by performing various steps in accordance with the same method and under the same conditions as in Example 1.

The thickness of the electroless nickel-phosphorus plating layer 4 and of the electroless gold plating layer 5 formed on the front-side electrode 3a and on the back-side electrode 3b and the warping amount of each semiconductor element 1 were measured in the same way as in Example 1. The results are given in Table 6.

TABLE 6

| | | Sample No. | | | |
|---|---|---|---|---|---|
| | | 3-1 | 3-2 | 3-3 | 3-4 |
| Front surface | Electroless nickel-phosphorus plating layer (μm) | 6.9 | 6.5 | 7.5 | 6.0 |
| | Electroless gold plating layer (μm) | 0.03 | 0.03 | 0.03 | 0.03 |
| Back surface | Electroless nickel-phosphorus plating layer (μm) | 4.4 | 4.6 | 2.9 | 4.5 |
| | Electroless gold plating layer (μm) | 0.03 | 0.03 | 0.03 | 0.03 |
| Proportion of the thickness of the electroless nickel-phosphorus plating layer [1] | | 1.6 | 1.4 | 2.6 | 1.3 |
| Proportion of the surface area of the electrode [2] | | 0.6 | 0.6 | 0.6 | 0.6 |
| Warp amount (mm) | | 1.3 | 0.9 | 1.1 | 1.5 |

(Remarks)
[1] Proportion of the thickness of the electroless nickel-phosphorus plating layer formed on the front-side electrode with respect to the thickness of the electroless nickel-phosphorus plating layer formed on the back-side electrode.
[2] Proportion of the surface area of the front-side electrode with respect to the surface area of the back-side electrode.

Example 4

Semiconductor elements 1 having the structure illustrated in FIG. 1 were produced in Example 4.

In Example 4 an experiment was carried out by modifying the bath load and the proportion of the surface area of the front-side electrode 3a with respect to the surface area of the back-side electrode 3b. Next, semiconductor elements 1 were obtained by performing various steps in accordance with the same method and under the same conditions as in Example 1, except that herein the bath load and the proportion of the surface areas had been modified.

The thickness of the electroless nickel-phosphorus plating layer 4 and of the electroless gold plating layer 5 formed on the front-side electrode 3a and on the back-side electrode 3b and the warping amount of each semiconductor element 1 were measured in the same way as in Example 1. The results are given in Table 7.

TABLE 7

| | | Sample No. | | | |
|---|---|---|---|---|---|
| | | 4-1 | 4-2 | 4-3 | 4-4 |
| Front surface | Electroless nickel-phosphorus plating layer (μm) | 6.7 | 6.5 | 6.4 | 7.1 |
| | Electroless gold plating layer (μm) | 0.03 | 0.03 | 0.03 | 0.03 |
| | Bath load (dm$^2$/L) | 1.0 | 0.5 | 1.0 | 1.0 |
| Back surface | Electroless nickel-phosphorus plating layer (μm) | 4.4 | 4.2 | 2.9 | 2.1 |
| | Electroless gold plating layer (μm) | 0.03 | 0.03 | 0.03 | 0.03 |
| | Bath load (dm$^2$/L) | 2.5 | 2.5 | 5.0 | 8.0 |
| Proportion of the thickness of the electroless nickel-phosphorus plating layer [1] | | 1.5 | 1.5 | 2.2 | 3.4 |
| Proportion of the surface area of the electrode [2] | | 0.7 | 0.7 | 0.7 | 0.8 |
| Warp amount (mm) | | 0.7 | 0.8 | 1.0 | 1.4 |

(Remarks)
[1] Proportion of the thickness of the electroless nickel-phosphorus plating layer formed on the front-side electrode with respect to the thickness of the electroless nickel-phosphorus plating layer formed on the back-side electrode.
[2] Proportion of the surface area of the front-side electrode with respect to the surface area of the back-side electrode.

Example 5

Semiconductor elements 1 having the structure illustrated in FIG. 1 were produced in Example 5.

In Example 5 semiconductor elements 1 were obtained by performing various steps in accordance with the same method and under the same conditions as in Example 1, but herein the proportion of the surface area of the front-side electrode 3a with respect to the surface area of the back-side electrode 3b was set to 0.70, and electroless nickel-phosphorus plating was carried out in accordance with the method illustrated in FIG. 3. The materials given in Table 8 were used as the dummy material 11 during electroless nickel-phosphorus plating. The distance between the back-side electrode 3b and the dummy material 11 was set as given in Table 8.

The thickness of the electroless nickel-phosphorus plating layer 4 and of the electroless gold plating layer 5 formed on the front-side electrode 3a and on the back-side electrode 3b and the warping amount of each semiconductor element 1 were measured in the same way as in Example 1. The results are given in Table 8.

TABLE 8

| | | Sample No. | | | |
|---|---|---|---|---|---|
| | | 5-1 | 5-2 | 5-3 | 5-4 |
| Front surface | Electroless nickel-phosphorus plating layer (μm) | 6.7 | 6.5 | 6.4 | 6.6 |
| | Electroless gold plating layer (μm) | 0.03 | 0.03 | 0.03 | 0.03 |
| Back surface | Electroless nickel-phosphorus plating layer (μm) | 4.4 | 4.2 | 2.9 | 2.1 |
| | Electroless gold plating layer (μm) | 0.03 | 0.03 | 0.03 | 0.03 |
| | Dummy material | Iron | Platinum | Gold | Nickel |
| Distance (mm) between back-side electrode and dummy material | | 10 | 10 | 10 | 5 |
| Proportion of the thickness of the electroless nickel-phosphorus plating layer [1] | | 1.5 | 1.5 | 2.2 | 3.1 |
| Proportion of the surface area of the electrode [2] | | 0.7 | 0.7 | 0.7 | 0.7 |
| Warp amount (mm) | | 0.5 | 0.9 | 1.1 | 1.2 |

(Remarks)
[1] Proportion of the thickness of the electroless nickel-phosphorus plating layer formed on the front-side electrode with respect to the thickness of the electroless nickel-phosphorus plating layer formed on the back-side electrode.
[2] Proportion of the surface area of the front-side electrode with respect to the surface area of the back-side electrode.

Example 6

Semiconductor elements 1 having the structure illustrated in FIG. 1 were produced in Example 6.

In Example 6 semiconductor elements 1 were obtained by performing various steps in accordance with the same method and under the same conditions as in Example 1, but herein the proportion of the surface area of the front-side electrode 3a with respect to the surface area of the back-side electrode 3b was set to 0.70, and electroless nickel-phosphorus plating was carried out in accordance with the method illustrated in FIG. 4. The distance between the back-side electrodes 3b was set as given in Table 9.

The thickness of the electroless nickel-phosphorus plating layer 4 and of the electroless gold plating layer 5 formed on the front-side electrode 3a and on the back-side electrode 3b and the warping amount of each semiconductor element 1 were measured in the same way as in Example 1. The results are given in Table 8.

TABLE 9

| | | Sample No. | | | |
|---|---|---|---|---|---|
| | | 6-1 | 6-2 | 6-3 | 6-4 |
| Front surface | Electroless nickel-phosphorus plating layer (μm) | 6.9 | 6.5 | 6.0 | 5.5 |
| | Electroless gold plating layer (μm) | 0.03 | 0.03 | 0.03 | 0.03 |
| Back surface | Electroless nickel-phosphorus plating layer (μm) | 4.4 | 4.2 | 3.5 | 2.1 |
| | Electroless gold plating layer (μm) | 0.03 | 0.03 | 0.03 | 0.03 |
| Distance between back-side electrodes (mm) | | 30 | 20 | 10 | 5 |
| Proportion of the thickness of the electroless nickel-phosphorus plating layer [1] | | 1.6 | 1.5 | 1.7 | 2.6 |
| Proportion of the surface area of the electrode [2] | | 0.7 | 0.7 | 0.7 | 0.7 |
| Warp amount (mm) | | 0.5 | 0.9 | 1.1 | 1.2 |

(Remarks)
[1] Proportion of the thickness of the electroless nickel-phosphorus plating layer formed on the front-side electrode with respect to the thickness of the electroless nickel-phosphorus plating layer formed on the back-side electrode.
[2] Proportion of the surface area of the front-side electrode with respect to the surface area of the back-side electrode.

Example 7

Solder was laid on respective substrates and the semiconductor elements 1 obtained in Examples 1 to 6 above were placed on the substrates, followed by heating in a reflow oven, to solder thereby the back-side electrode 3b of each semiconductor element 1 to the respective substrate. No voids were present in the solder portions as a result, nor was warping observed in the soldered semiconductor elements 1.

Example 8

In Example 8 semiconductor elements 1 having the structure illustrated in FIG. 1 were produced in accordance with the same method and under the same conditions as in Example 1, but modifying therein the thickness of the electroless nickel-phosphorus plating layer on the front-side electrode 3a and the back-side electrode 3b, and modifying the proportion of the surface area of the front-side electrode 3a with respect to the back-side electrode 3b; thereafter, the back-side electrode 3b of each semiconductor element 1 was soldered to a substrate in accordance with the same method as in Example 7.

The thickness of the electroless nickel-phosphorus plating layer 4 and of the electroless gold plating layer 5 formed on the front-side electrode 3a and on the back-side electrode 3b and the warping amount of each semiconductor element 1 were measured in the same way as in Example 1. The presence or absence of voids in the solder portions was evaluated. The results are given in Table 10.

TABLE 10

|  |  | Sample No. | | | |
| --- | --- | --- | --- | --- | --- |
|  |  | 8-1 | 8-2 | 8-3 | 8-4 |
| Front surface | Electroless nickel-phosphorus plating layer (μm) | 7.1 | 7.0 | 7.2 | 6.8 |
|  | Electroless gold plating layer (μm) | 0.03 | 0.03 | 0.03 | 0.03 |
| Back surface | Electroless nickel-phosphorus plating layer (μm) | 3.9 | 5.8 | 6.9 | 6.6 |
|  | Electroless gold plating layer (μm) | 0.03 | 0.03 | 0.03 | 0.03 |
| Proportion of the thickness of the electroless nickel-phosphorus plating layer [1] | | 1.8 | 1.2 | 1.05 | 0.98 |
| Proportion of the surface area of the electrode [2] | | 0.6 | 0.8 | 0.85 | 0.9 |
| Warp amount (mm) [3] | | 0.7 | 0.3 | 0.1 | −0.3 |
| Presence of voids | | No | No | No | Yes |

(Remarks)
[1] Proportion of the thickness of the electroless nickel-phosphorus plating layer formed on the front-side electrode with respect to the thickness of the electroless nickel-phosphorus plating layer formed on the back-side electrode.
[2] Proportion of the surface area of the front-side electrode with respect to the surface area of the back-side electrode.
[3] A positive numerical value denotes amount of warping such that the front surface of the semiconductor element is bowed inward, and a negative numerical value denotes an amount of warping such that the back surface of the semiconductor element is bowed inward.

As Table 10 reveals, no voids occurred in the solder portions when the proportion of the thickness of the electroless nickel-phosphorus plating layer formed on the front-side electrode 3a with respect to the thickness of the electroless nickel-phosphorus plating layer formed on the back-side electrode 3b was 1.0 or higher (samples 8-1 to 8-3), whereas voids occurred in solder portions when the above proportion was lower than 1.0 (sample 8-4).

Further, no voids occurred in solder portions when the proportion of the surface area of the front-side electrode 3a with respect to the surface area of the back-side electrode 3b was 0.85 or lower (samples 8-1 to 8-3), whereas voids occurred in solder portions when the above proportion exceeded 0.85 (sample 8-4).

The above results indicate that the present invention succeeds in providing a semiconductor element and production method thereof that allow the occurrence of voids inside solder during mounting by soldering to be prevented.

The present international application claims priority based on Japanese Patent Application No. 2015-077528, filed on Apr. 6, 2015, the entire contents of which are incorporated herein by reference.

EXPLANATION ON NUMERALS

1 Semiconductor element
2 Front-back conduction-type substrate
3a Front-side electrode
3b Back-side electrode
4 Electroless nickel-phosphorus plating layer
5 Electroless gold plating layer
6 Protective film
10 Electroless nickel-phosphorus plating solution
11 Dummy material

The invention claimed is:

1. A semiconductor element in which an electroless nickel-phosphorus plating layer is formed on both a front-side electrode and a back-side electrode of a front-back conduction-type substrate,
wherein the proportion of a thickness of the electroless nickel-phosphorus plating layer formed on the front-side electrode with respect to a thickness of the electroless nickel-phosphorus plating layer formed on the back-side electrode is in a range of 1.0 to 3.5 for imparting a warping to the semiconductor element.

2. The semiconductor element according to claim 1, wherein the front-side electrode is formed of an aluminum alloy and the aluminum alloy contains an element nobler than aluminum.

3. The semiconductor element according to claim 2, wherein the element contained in the aluminum alloy that forms the front-side electrode is nobler than the element contained in the aluminum alloy that forms the back-side electrode.

4. A method for producing a semiconductor element, the method comprising the formation of a front-side electrode and a back-side electrode on a front-back conduction-type substrate, followed by performing electroless nickel-phosphorus plating by a zincate method on both the front-side electrode and the back-side electrode simultaneously,
wherein the proportion of a surface area of the front-side electrode with respect to a surface area of the back-side electrode is set in a range of 0.3 to 0.85 for imparting a warping to the semiconductor element.

5. The method for producing a semiconductor element according to claim 4, wherein the front-side electrode is formed of an aluminum alloy and the aluminum alloy contains an element nobler than aluminum.

6. The method for producing a semiconductor element according to claim 5, wherein the element contained in the aluminum alloy that forms the front-side electrode is nobler than the element contained in the aluminum alloy that forms the back-side electrode.

7. The method for producing a semiconductor element according to claim 4, wherein the electroless nickel-phosphorus plating is performed while arranging a dummy material at a position opposing the back-side electrode.

8. The method for producing a semiconductor element according to claim 4, comprising the preparation of a plurality of front-back conduction-type substrates having the front-side electrode and the back-side electrode formed thereon, and performing the electroless nickel-phosphorus plating while opposing the back-side electrodes of the plurality of front-back conduction-type substrates each other.

9. The semiconductor element according to claim 1, wherein the warpage amount is from 0.2 mm to 2 mm.

10. The semiconductor element according to claim 1, wherein the back-side electrode is formed of an aluminum alloy and wherein the aluminum alloy contains an element nobler than aluminum.

11. The method for producing a semiconductor element according to claim 4, wherein the back-side electrode is formed of an aluminum alloy and wherein the aluminum alloy contains an element nobler than aluminum.

* * * * *